US011862581B2

(12) United States Patent
Park et al.

(10) Patent No.: US 11,862,581 B2
(45) Date of Patent: Jan. 2, 2024

(54) SEMICONDUCTOR PACKAGE INCLUDING CONDUCTIVE CRACK PREVENTING LAYER

(71) Applicant: SAMSUNG ELECTRONICS CO., LTD., Suwon-si (KR)

(72) Inventors: Ji Eun Park, Suwon-si (KR); Mi Jin Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/886,763

(22) Filed: Aug. 12, 2022

(65) Prior Publication Data
US 2022/0392853 A1 Dec. 8, 2022

Related U.S. Application Data

(63) Continuation of application No. 16/985,918, filed on Aug. 5, 2020, now Pat. No. 11,417,612, which is a (Continued)

(30) Foreign Application Priority Data
Aug. 10, 2018 (KR) .................. 10-2018-0093929

(51) Int. Cl.
*H01L 21/82* (2006.01)
*H01L 23/00* (2006.01)
(Continued)

(52) U.S. Cl.
CPC .......... *H01L 23/562* (2013.01); *H01L 23/041* (2013.01); *H01L 23/3128* (2013.01);
(Continued)

(58) Field of Classification Search
CPC . H01L 23/562; H01L 23/041; H01L 23/3128; H01L 23/49822; H01L 24/08;
(Continued)

(56) References Cited

U.S. PATENT DOCUMENTS 9,087,832 B2 * 7/2015 Huang ................ H01L 23/5389
9,711,438 B2   7/2017 Lin et al.
(Continued)

FOREIGN PATENT DOCUMENTS

KR    10-2002-0072035 A    9/2002
KR       10-0817079 B1     3/2008
(Continued)

OTHER PUBLICATIONS

Communication dated Oct. 1, 2019, issued by the Korean Intellectual Property Office in corresponding Korean Application No. 10-2018-0093929.

*Primary Examiner* — Tan N Tran
(74) *Attorney, Agent, or Firm* — Sughrue Mion, PLLC

(57) ABSTRACT

A semiconductor package includes a support frame, and including a cavity, a semiconductor chip disposed in the cavity and having an active surface on which contact pads are arranged, and a connection member on the support frame and on the active surface of the semiconductor chip. The semiconductor chip includes a first insulating film disposed on the active surface and exposing the contact pads, a second insulating film disposed on the first insulating film and including a first opening exposing connection regions of the contact pads, and a conductive crack preventing layer disposed on the connection regions and having an outer peripheral region extending to a portion of the second insulating film around the first opening. The connection member includes an insulating layer including a second opening
(Continued)

exposing the connection regions; and a redistribution layer connected to the contact pads through the second opening.

20 Claims, 18 Drawing Sheets

Related U.S. Application Data continuation of application No. 16/293,301, filed on Mar. 5, 2019, now Pat. No. 10,756,030.

(51) Int. Cl.
*H01L 23/31* (2006.01)
*H01L 23/04* (2006.01)
*H01L 23/498* (2006.01)

(52) U.S. Cl.
CPC ........ *H01L 23/49822* (2013.01); *H01L 24/08* (2013.01); *H01L 2224/08235* (2013.01)

(58) Field of Classification Search
CPC . H01L 2224/08235; H01L 2924/15153; H01L 2924/181; H01L 2924/3511; H01L 24/20; H01L 2924/18162; H01L 24/19; H01L 23/49816; H01L 2224/18; H01L 23/5389; H01L 24/02; H01L 24/03; H01L 24/11; H01L 24/13; H01L 2224/02331; H01L 2224/02381; H01L 2224/03; H01L 2224/111; H01L 2224/13008; H01L 2224/13016; H01L 23/564; H01L 23/04; H01L 23/3114; H01L 23/485; H01L 24/06
USPC .................................................. 438/119, 126
See application file for complete search history.

(56) References Cited

U.S. PATENT DOCUMENTS

2002/0125543 A1  9/2002  Moon et al.
2003/0207494 A1  11/2003  Suzuki et al.
2008/0128905 A1  6/2008  Lee et al.

FOREIGN PATENT DOCUMENTS

KR  10-2017-0121671 A  11/2017
KR  10-2018-0061109 A  6/2018

\* cited by examiner

I-I'

SEMICONDUCTOR PACKAGE INCLUDING CONDUCTIVE CRACK PREVENTING LAYER

CROSS-REFERENCE TO RELATED APPLICATION(S)

This is a continuation of U.S. application Ser. No. 16/985,918 filed Aug. 5, 2020, which is a continuation of U.S. application Ser. No. 16/293,301 filed Mar. 5, 2019, which claims the benefit of priority to Korean Patent Application No. 10-2018-0093929 filed on Aug. 10, 2018 in the Korean Intellectual Property Office, the disclosure of which is incorporated herein by reference in its entirety.

BACKGROUND

1. Technical Field

The present disclosure relates to a semiconductor package.

2. Description of Related Art

A packaging technique for achieving device lightness, slimness and compactness has been actively researched. In this regard, it is very important to ensure reliability of a package against thermal stress in a manufacturing process or a use environment.

Such thermal stress may occur intensively at contact points between dissimilar materials. Particularly, stress occurring at a point at which a redistribution layer and a passivation film of a semiconductor chip contact each other may cause serious reliability problems, such as causing cracks.

SUMMARY

An aspect of the present disclosure is to provide a semiconductor package in which degradations in reliability due to thermal stress may be reduced.

According to an aspect of the present disclosure, a semiconductor package includes a support frame having a first surface and a second surface opposing each other, and including a cavity connecting the first and second surfaces; a semiconductor chip disposed in the cavity, and having an active surface on which contact pads are arranged; and a connection member disposed on the second surface of the support frame and on the active surface of the semiconductor chip. The semiconductor chip includes a first insulating film disposed on the active surface and exposing the contact pads, a redistribution layer (RDL) pattern connected to the contact pads to extend onto the first insulating film, a second insulating film disposed on the active surface and including a first opening exposing a connection region of the RDL pattern, and a conductive crack preventing layer disposed on the connection region and having an outer peripheral region extending to a portion of the second insulating film around the first opening. The connection member includes an insulating layer disposed on the second surface of the support frame and on the active surface of the semiconductor chip and including a second opening exposing the connection region, and a redistribution layer connected to the connection region through the second opening.

According to an aspect of the present disclosure, a semiconductor package includes a support frame having a first surface and a second surface opposing each other, and including a cavity connecting the first and second surfaces; a semiconductor chip disposed in the cavity, and having an active surface on which contact pads are arranged; a connection member disposed on the second surface of the support frame and on the active surface of the semiconductor chip; and an encapsulant encapsulating the semiconductor chip disposed in the cavity. The semiconductor chip includes a first insulating film disposed on the active surface and exposing the contact pads, a second insulating film disposed on the first insulating film and including a first opening exposing connection regions of the contact pads, and a conductive crack preventing layer disposed on the connection regions and extending to a portion of the second insulating film around the first opening. The connection member includes an insulating layer disposed on the second surface of the support frame and on the active surface of the semiconductor chip, and including a second opening exposing the connection regions, the second opening being greater than the first opening; and a redistribution layer connected to the connection regions through the second opening.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
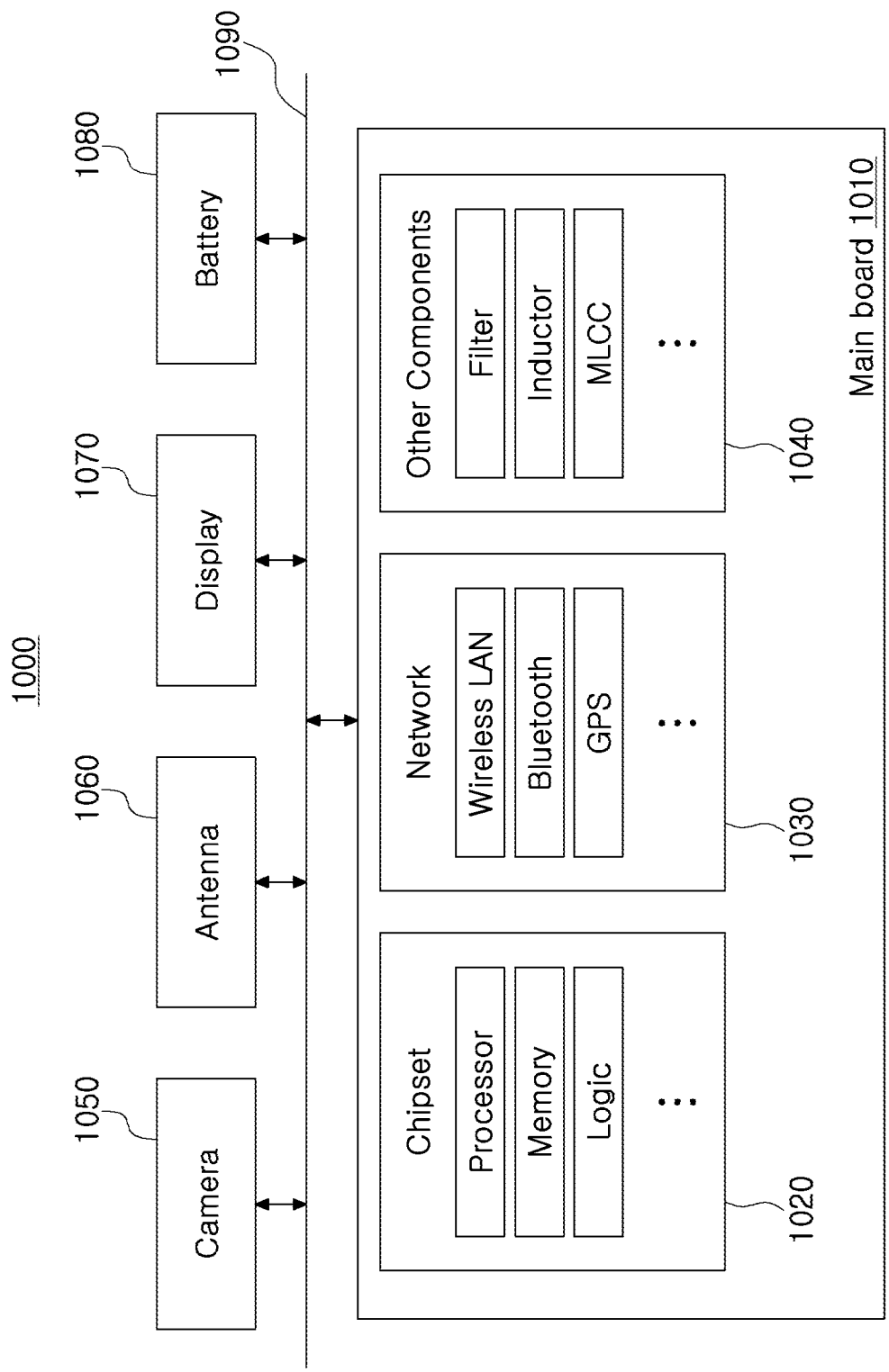
FIG. 1 is a schematic block diagram illustrating an example of an electronic device system.

Hereinafter, exemplary embodiments of the present disclosure will be described with reference to the accompanying drawings. The shape and size of constituent elements in the drawings may be exaggerated or reduced for clarity.

Electronic Device

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to other components, as described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access plus (HSPA+), high speed downlink packet access plus (HSDPA+), high speed uplink packet access plus (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
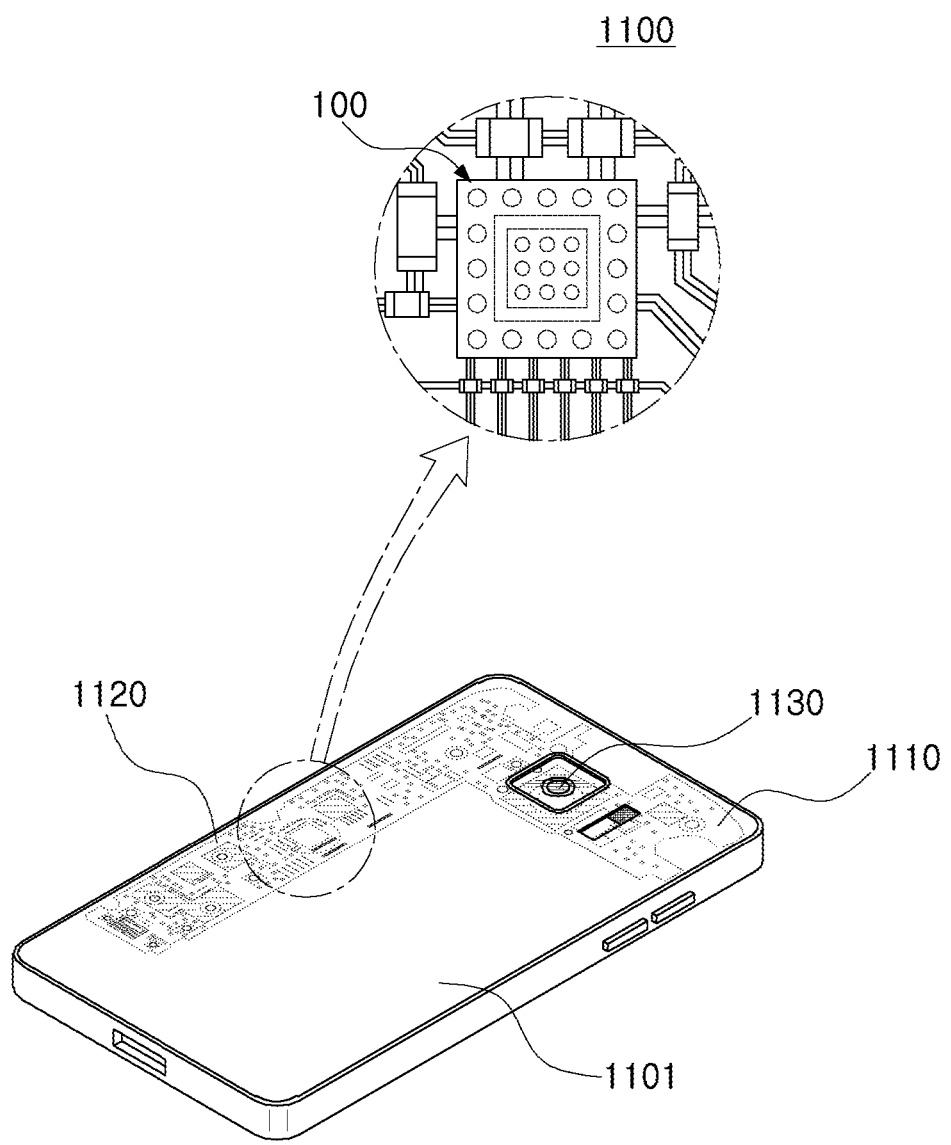
FIG. 2 is a schematic perspective view of an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself, and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a main board of the electronic device in terms of electrical connection. In detail, a size of contact pads of the semiconductor chip and an interval between the contact pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and use of packaging technology for buffering a difference in a circuit width between the semiconductor and the main board is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
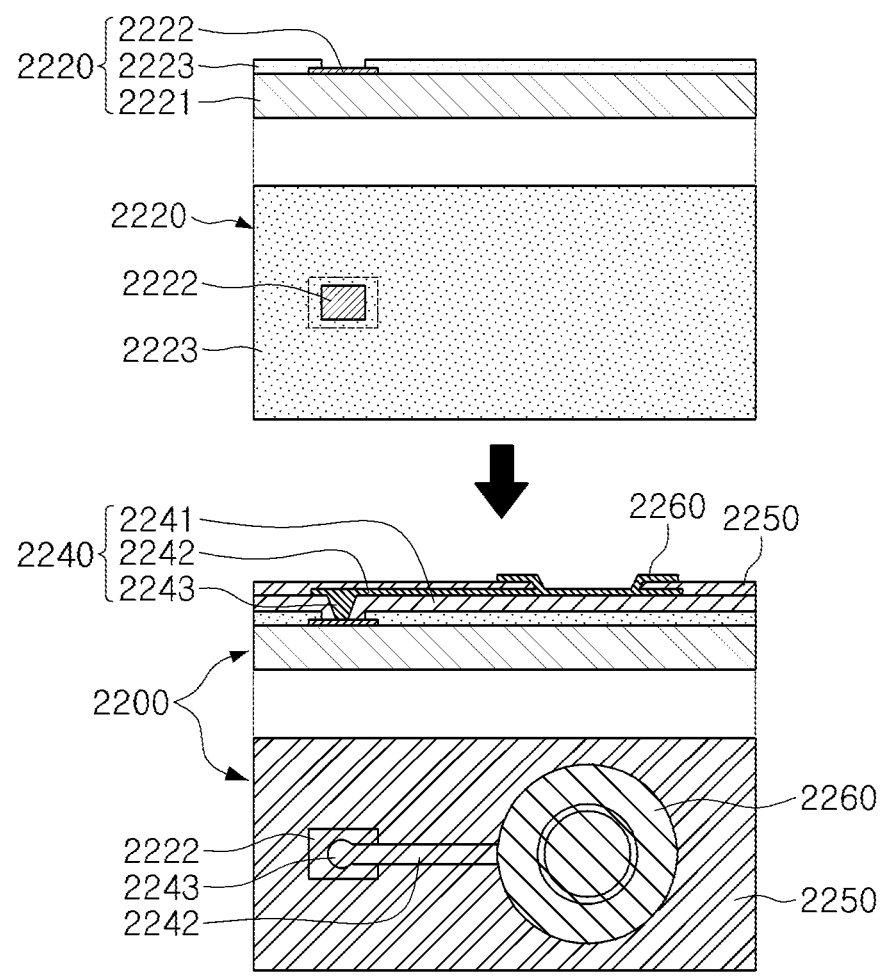
FIGS. 3A and 3B are cross-sectional views schematically illustrating a fan-in semiconductor package before and after packaging.
Figure 3B:
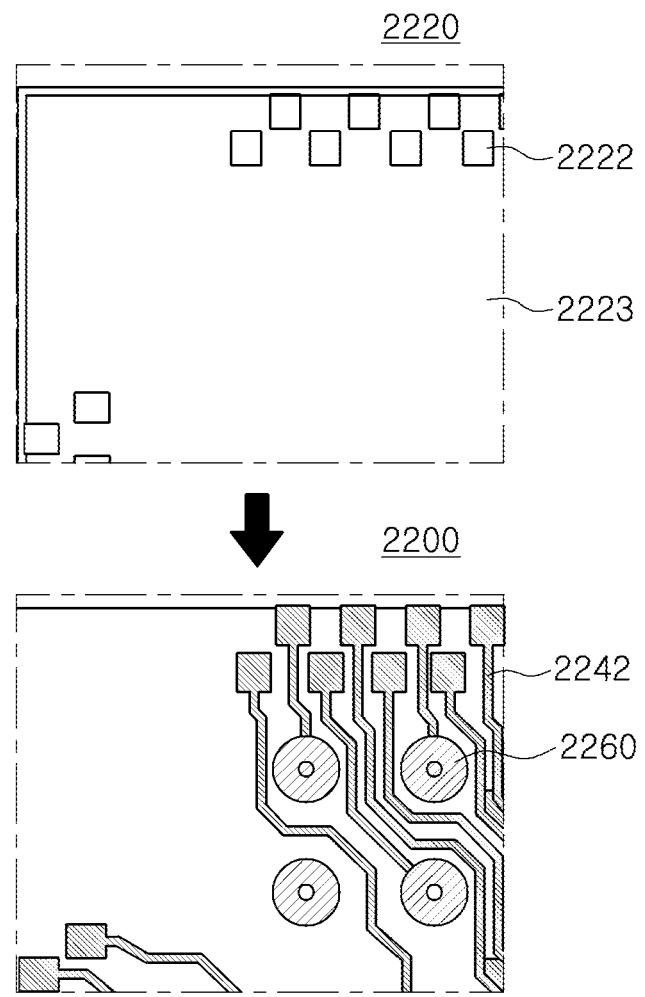
Figure 4:
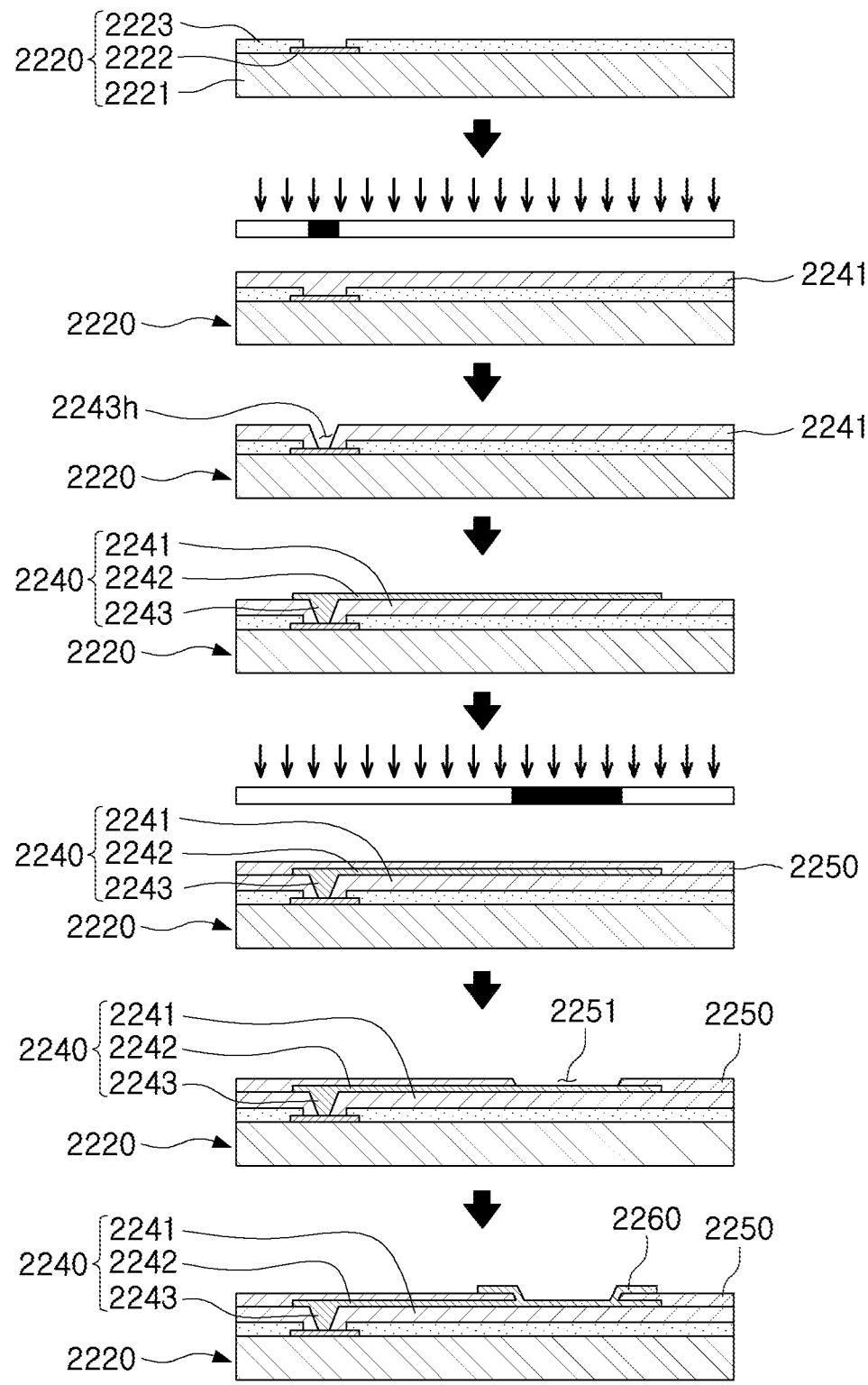
FIG. 4 is a schematic cross-sectional view of a packaging process of a fan-in semiconductor package.

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to FIGS. 3A, 3B and 4, a semiconductor chip 2220 may be, for example, an integrated circuit (IC) in a bare state, including a body 2221 including silicon (Si), germanium (Ge), gallium arsenide (GaAs), or the like, contact pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the contact pads 2222. In this case, since the contact pads 2222 are significantly small, it may be difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the contact pads 2222. The connection member 2240 may be formed by forming an insulating layer 2241 on the semiconductor chip 2220 using an insulating material such as a photoimageable dielectric (PID) resin, forming via holes 2243 opening on to the contact pads 2222, and then forming wiring patterns 2242 and vias 2243. Then, a passivation layer 2250 protecting the connection member 2240 may be formed, and an opening 2251 may be formed to have an underbump metal layer 2260, or the like, extending therethrough. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the contact pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
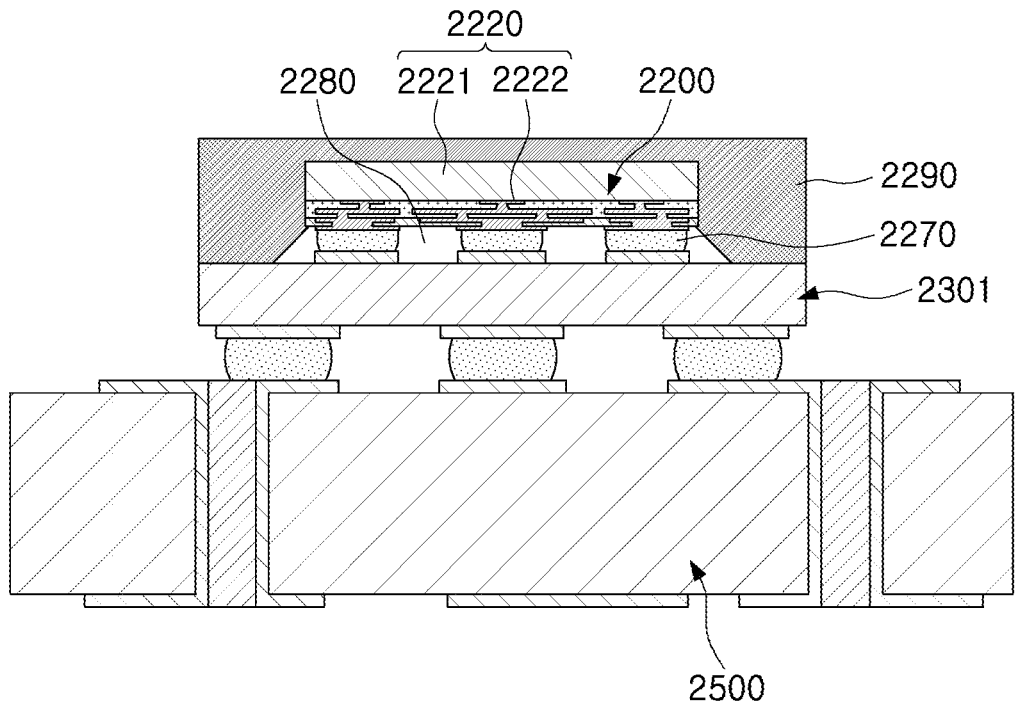
FIG. 5 is a cross-sectional view schematically illustrating a case in which a fan-in semiconductor package is mounted on an interposer substrate to ultimately be mounted on a main board of an electronic device.
Figure 6:
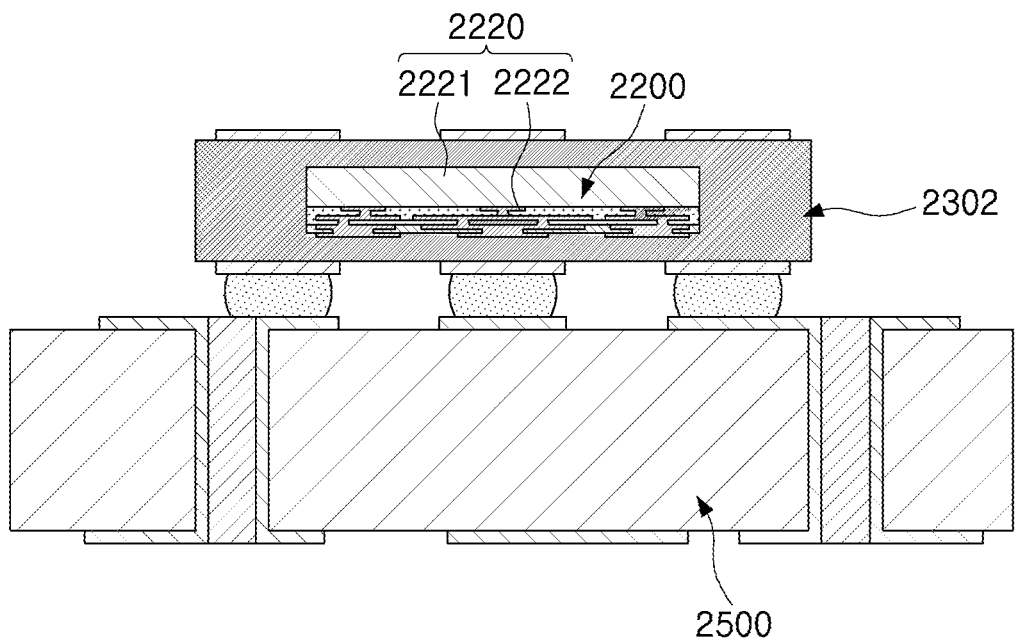
FIG. 6 is a cross-sectional view schematically illustrating a case in which a fan-in semiconductor package is embedded in an interposer substrate to ultimately be mounted on a main board of an electronic device.

FIG. 5 is a schematic cross-sectional view illustrating a fan-in semiconductor package mounted on an interposer substrate that is ultimately mounted on a main board of an electronic device, and FIG. 6 is a schematic cross-sectional view illustrating a fan-in semiconductor package embedded in an interposer substrate that is ultimately mounted on a main board of an electronic device.

Referring to FIGS. 5 and 6, in a fan-in semiconductor package 2200, contact pads 2222 (i.e., I/O terminals) of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, as shown in FIG. 6, the fan-in semiconductor package 2200 may be embedded in an interposer substrate 2302. The contact pads 2222 (i.e., I/O terminals) of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board (e.g., 2500) of the electronic device. Therefore, the fan-in semiconductor package may be mounted on the separate interposer substrate (e.g., 2301 or 2302) and be then mounted on the main board of the electronic device through a packaging process or may be mounted and used on the main board of the electronic device in a state in which the fan-in semiconductor package is embedded in the interposer substrate.

Fan-Out Semiconductor Package

Figure 7:
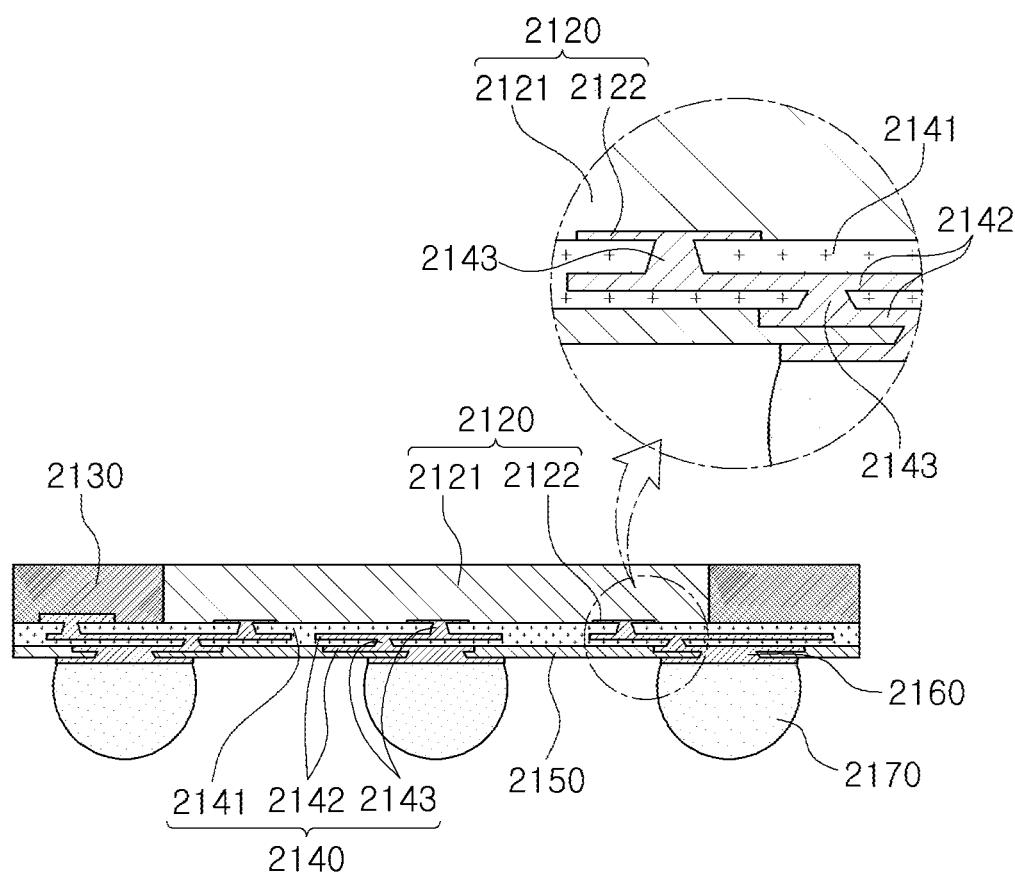
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and contact pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the contact pads 2122, a passivation layer (not illustrated), and the like. The connection member 2140 may include an insulating layer 2141, redistribution layers 2142 formed on the insulating layer 2141, and vias 2143 electrically connecting the contact pads 2122 and the redistribution layers 2142 to each other.

In the present manufacturing process, the connection member 2140 may be formed after the encapsulant 2130 is formed outside the semiconductor chip 2120. In this case, a process for forming the connection member 2140 is performed to form the via(s) connecting the redistribution layers and the contact pads 2122 of the semiconductor chip 2120 to each other and the redistribution layers 2142, and the vias 2143 may thus have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection member 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. On the other hand, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection member 2140 formed on the semiconductor chip as described above. Therefore, even in the case that a size of the semiconductor chip 2120 is decreased, a standardized ball layout may be used in the fan-out semiconductor package as it is, such that the fan-out semiconductor package may be mounted on the main board of the electronic device without using a separate interposer substrate, as described below.

Figure 8:
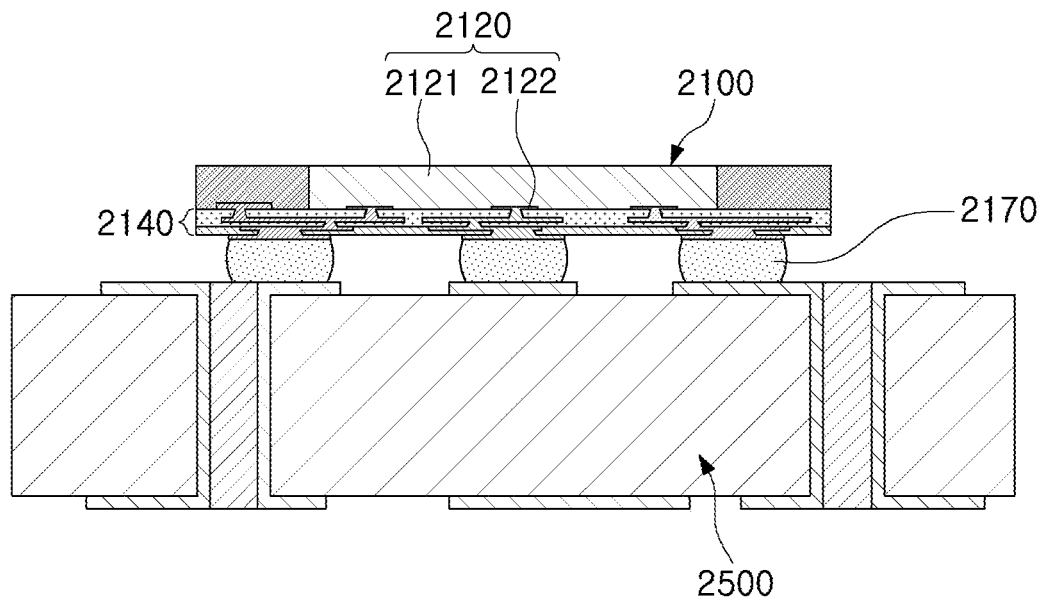
FIG. 8 is a schematic cross-sectional view of a case for a fan-out semiconductor package mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the contact pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem caused by the occurrence of a warpage phenomenon.

Meanwhile, the fan-out semiconductor package refers to a packaging technology for mounting the semiconductor chip on the main board of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
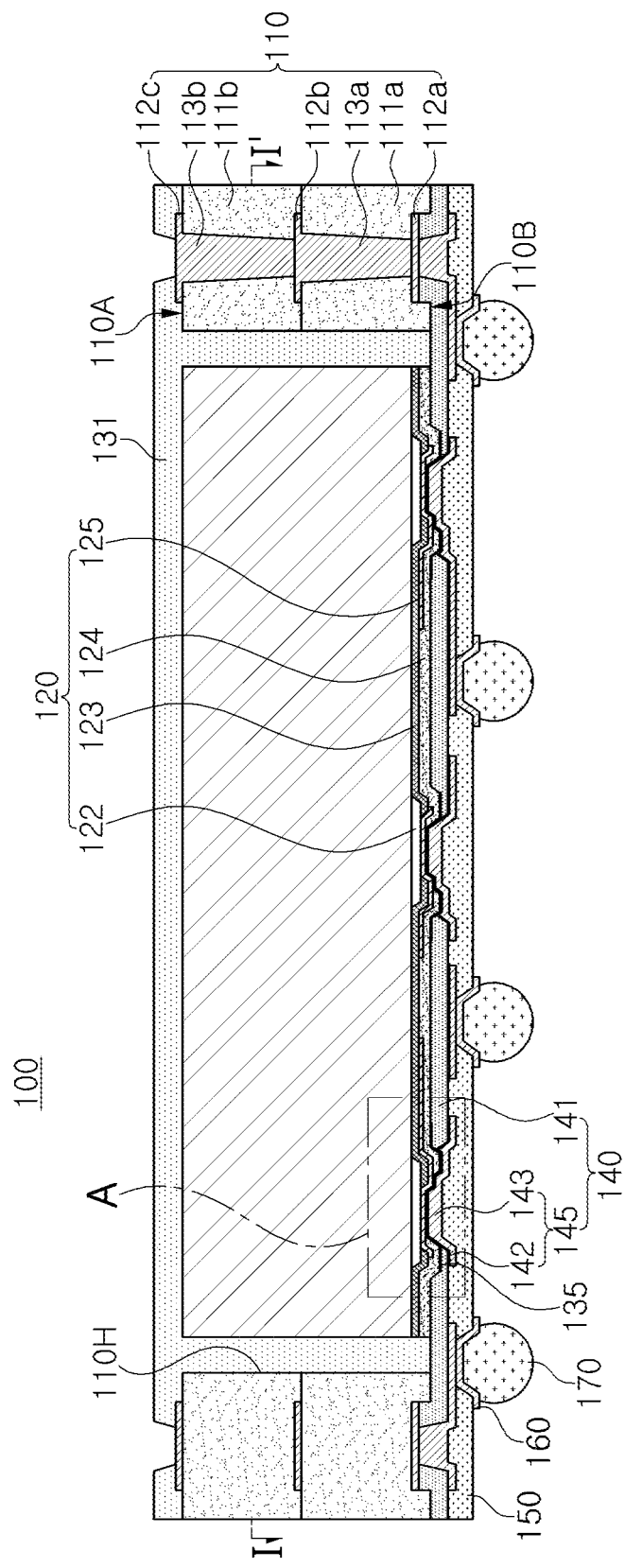
FIG. 9 is a schematic cross-sectional view of a semiconductor package according to an exemplary embodiment in the present disclosure.
Figure 10:
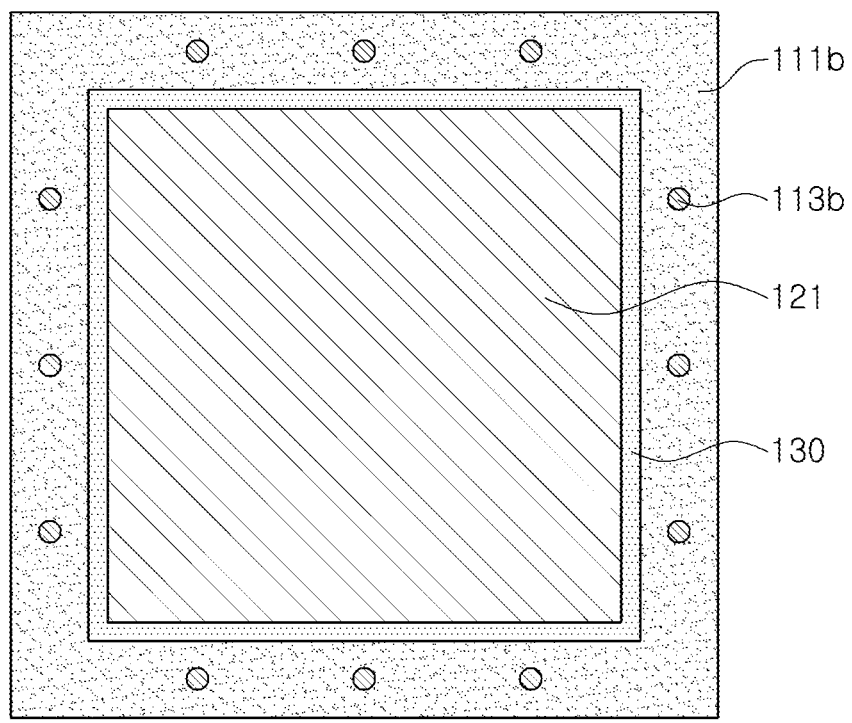
FIG. 10 is a plan view of the semiconductor package, taken along line I-I' in FIG. 9.

FIG. 9 is a schematic cross-sectional view of a semiconductor package according to an exemplary embodiment in the present disclosure, and FIG. 10 is a plan view of the semiconductor package, taken along line I-I' in FIG. 9.

Referring to FIGS. 9 and 10, a semiconductor package 100 according to an exemplary embodiment may include a support frame 110 having first and second surfaces 110A and 110B opposing each other and including a cavity 110H connecting the first surfaces 110A and the second surfaces 110B, a semiconductor chip 120 disposed in the cavity 110H and having an active surface on which contact pads 122 are arranged, a connection member 140 disposed on the second surface 110B of the support frame 110 and the active surface of the semiconductor chip 120, and an encapsulant 131 encapsulating the semiconductor chip 120 disposed in the cavity 110H.

The semiconductor chip 120 employed in the exemplary embodiment may include a RDL pattern 125 extending from the contact pad 122, together with a first insulating film 123 and a second insulating film 124, in a passivation structure. The RDL pattern 125 may be a conductive pattern relocating a connection region CA connected to an external circuit, for example, a redistribution layer 145. The RDL pattern 125 and the first and second insulating films 123 and 124 may have been formed in a wafer level process for manufacturing the semiconductor chip 120.

Figure 11:
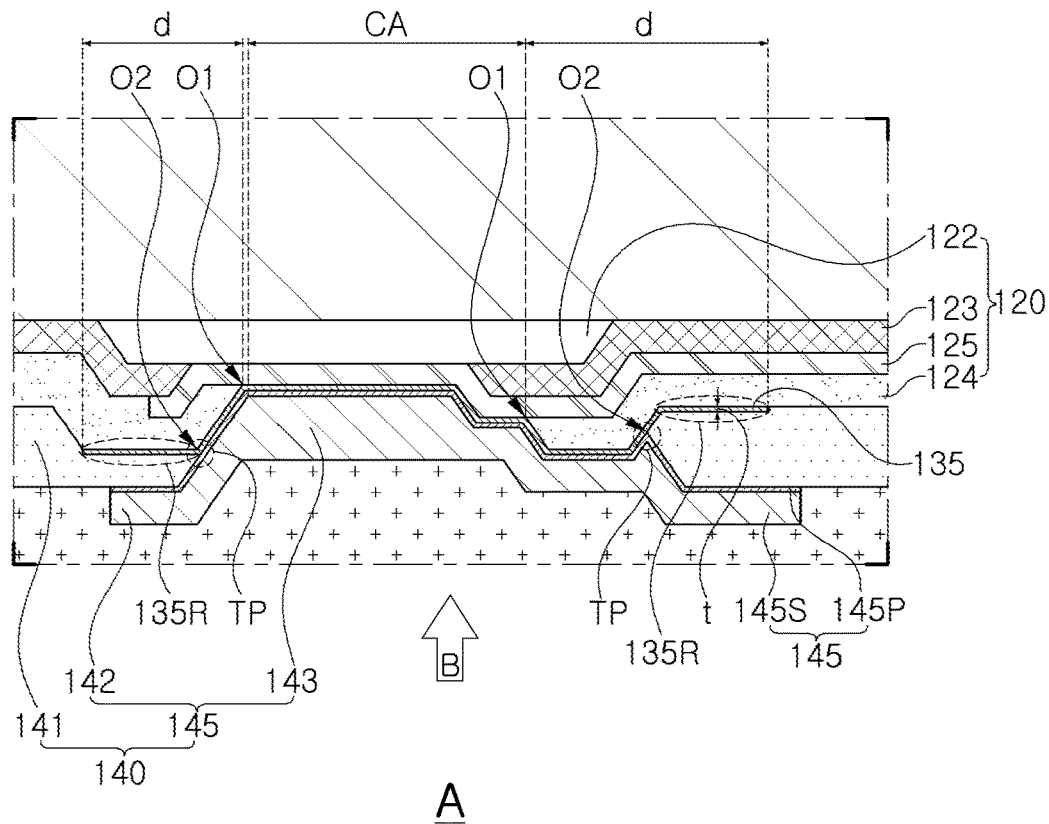
FIG. 11 is an enlarged cross-sectional view illustrating portion A of the semiconductor package of FIG. 9.

FIG. 11 is an enlarged cross-sectional view illustrating portion A of the semiconductor package of FIG. 9.

Referring to FIG. 11 together with FIG. 9, the first insulating film 123 may be disposed on the active surface of the semiconductor chip 120, and may be configured to expose the contact pad 122. The first insulating film 123 may include at least one of an oxide or a nitride. In some embodiments, the first insulating film 123 may be a silicon oxide film or a silicon nitride film. In some other embodiments, the first insulating film 123 may include a first film formed of a silicon oxide film or a silicon nitride film, and a second film formed of an organic insulating material such as polyimide (PI).

The RDL pattern 125 may be connected to the contact pad 122 and may extend onto the first insulating layer 123. This RDL pattern 125 allows, the connection region CA to be connected to the redistribution layer 145, to be relocated on another required position of the active surface of the semiconductor chip 120. For example, the RDL pattern 125 may be formed of copper (Cu). The second insulating film 124 may be disposed on the active surface and may have a first opening O1 as viewed from direction B as shown in FIG. 11, i.e. as viewed from a passivation layer 150) defining the connection region CA of the RDL pattern 125. The first opening O1 may be a boundary line between the second insulating film 124 and another layer connected to the second insulating film 124 and created by exposing the connection region CA wherein another layer is the layer deposited on one of the surface of the second insulating film 124 and facing to the passivation layer 150. The second insulating film 124 may include an organic insulating material such as polyimide (PI).

The semiconductor package 100 according to this embodiment may further include a conductive crack preventing layer 135 disposed on the connection region CA and extending to a portion of the second insulating film 124 around the first opening O1. In this specification, a portion of the conductive crack preventing layer 135 extending to the portion of the second insulating film 124 around the first opening O1 may be referred to as an "outer peripheral region 135R".

The connection member 140 may be disposed on the second surface 110B of the support frame 110 and on the active surface of the semiconductor chip 120, and may further include an insulating layer 141 having a second opening O2, as viewed from direction B as shown in FIG. 11, i.e. as viewed from a passivation layer 150), exposing the connection region CA, and the redistribution layer 145 may be connected to the connection region CA through the second opening O2. The second opening O2 may be a boundary line between the insulating layer 141 and another layer connected to the insulating layer 141 and created by exposing the connection region CA wherein another layer is the layer deposited on one of the surface of the insulating film 141 and facing to the passivation layer 150. The redistribution layer 145 may include the RDL pattern 142 disposed on the insulating layer 141, and a RDL via 143 penetrating through the insulating layer 141 to be connected to the connection region CA and the like.

The insulating layer 141 may be formed of various insulating materials. For example, the insulating layer 141 may include a thermosetting resin such as an epoxy resin, or a thermoplastic resin such as polyimide. In a specific example, the insulating layer 141 may include a prepreg resin, Ajinomoto Build-up Film (ABF), FR-4 resin, bismaleimide-triazine (BT) resin, or a photoimageable dielectric (PID) resin such as polybenzoxazole.

The insulating layer 141 may be formed of an insulating material different from that of the second insulating film 124. For example, the second insulating film 124 may include a non-photoimageable dielectric material, and the insulating layer 141 may include a photoimageable dielectric material. In another example, the second insulating film 124 may include a photoimageable dielectric material, and the insulating layer 141 may include non-photoimageable dielectric material.

The outer peripheral region 135R of the conductive crack preventing layer 135 may be located between the insulating layer 141 and the second insulating film 124. The arrangement of the conductive crack preventing layer 135 may prevent crack propagation to improve reliability of the semiconductor package 100.

In detail, referring to FIG. 11, at a point indicated by "TP", a metal such as Cu, for example, the redistribution layer 145, may be in contact with an insulating material, for example, the second insulating film 124 and the insulating layer 141. At the contact point of these dissimilar materials, stress due to a difference in thermal expansion coefficient may be concentrated, and thus, cracks C may occur. However, such a crack C may be prevented from propagating in a direction toward the semiconductor chip 120 and from damaging the RDL pattern 125 or the semiconductor chip 120, by the conductive crack preventing layer 135.

The conductive crack preventing layer 135 may be formed of a conductive material such as a metal having excellent adhesion. For example, the conductive crack preventing layer 135 may include at least one of titanium (Ti) or tungsten (W).

In this embodiment, as illustrated in FIG. 11, in the case in which the redistribution layer 145 includes a seed layer 145S and a plating layer 145P disposed on the seed layer 145S, the conductive crack preventing layer 135 may be formed of the same material as that of the seed layer 145S. For example, the conductive crack preventing layer 135 and the seed layer 145S may be a Ti/W layer or a Ti/Cu layer.

A thickness "t" of the conductive crack preventing layer 135 may be 50 nm or more, in detail, 100 nm or more to obtain sufficient stress and crack propagation preventing effect, and the conductive crack preventing layer 135 may be formed to have a thickness of 1 μm or less, similarly to a thickness of the seed layer 145S, but the thickness thereof is not limited thereto. In one embodiment, the thickness of the conductive crack preventing layer 135 may be 200 nm, 300 nm, 400 nm, 500 nm, 600 nm, 700 nm, 800 nm, or 900 nm.

Figure 12:
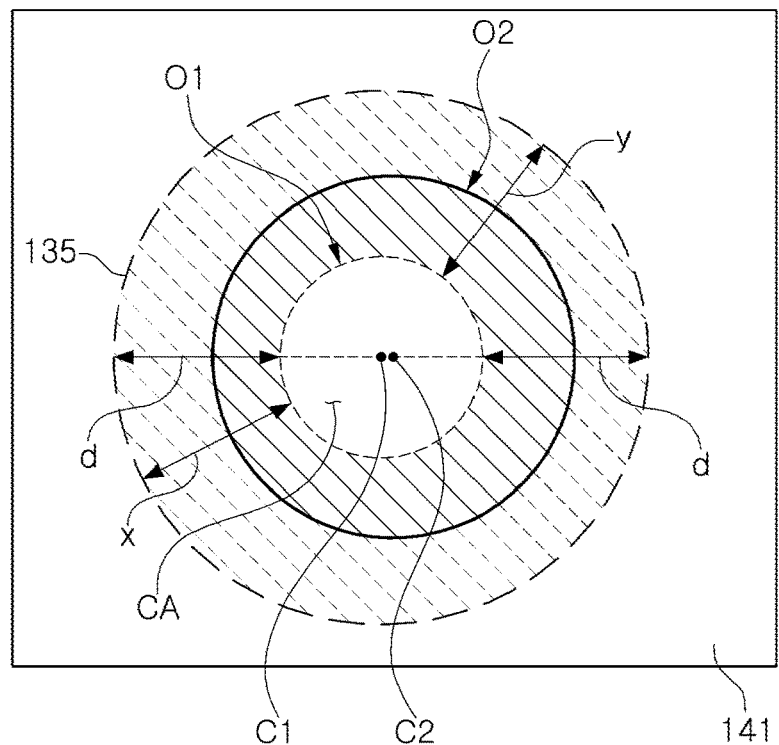
FIG. 12 is a plan view of a portion of the semiconductor package of FIG. 11 when viewed in direction B.

FIG. 12 is a plan view of a portion of the semiconductor package of FIG. 11 when viewed in direction B.

Referring to the plan view of FIG. 12, the second opening O2 of the insulating layer 141 has an area larger than an area of the first opening O1, and may be disposed around the first opening O1, in such a manner that an outer peripheral region of the conductive crack preventing layer 135, a hatched portion in FIG. 12, may be exposed.

This arrangement is to precisely align the second opening O2 of the insulating layer such that the connection region CA of the first opening O1 is sufficiently exposed. As a result, the above-described contact point TP may inevitably occur, and disadvantageous propagation of stress or cracks occurring at the contact point TP may be prevented by the conductive crack preventing layer 135.

As illustrated in FIG. 12, a center C1 of the first opening O1 and a center C2 of the second opening O2 may not exactly coincide with each other. In consideration of this alignment error, the outer peripheral region may be designed to have a sufficient width "d." The width d is a distance between an edge of the conductive crack preventing layer 135 and O1 measured along a line passing through C1 and C2. For example, a width "d" of the outer peripheral region may be at least 5 μm. In one embodiment, the width of the outer peripheral region is 10 μm, 20 μm, 30 μm, 40 μm, or 50 μm.

The outer peripheral region of the conductive crack preventing layer 135 may be formed to be prevented from extending to another connection region of the RDL pattern 125. For example, the conductive crack preventive layer 135 may be formed by performing deposition on an entire surface and then by performing a selective etching process using photolithography such that a required region, for example, a connection region and a periphery thereof, may only remain.

As shown in FIG. 9, the semiconductor package 100 according to this embodiment may include a passivation layer 150 disposed on a lower surface of the connection member 140. The passivation layer 150 may have a plurality of openings exposing a portion of the redistribution layer 145. An underbump metallurgy (UBM) layer 160 may be disposed in the opening of the passivation layer 150, and may be connected to the redistribution layer 145. An electrical connection structure 170 may be formed on the UBM layer 160, to be connected to an external circuit such as a mother board or the like.

Hereinafter, main components of the semiconductor package 100 according to the exemplary embodiment will be described in more detail.

The semiconductor chip 120 may be formed, based on an active wafer. A body of the semiconductor chip 120 may include silicon (Si), germanium (Ge), gallium arsenide (GaAs), or the like. The contact pad 122 is used to electrically connect the semiconductor chip 120 to other components, and a metal such as aluminum (Al) may be used as a material of the contact pad 122. As described above, the RDL pattern 125 redistributing the contact pad 122 and a passivation structure having the first and second insulating films 123 and 124 may be formed on the body.

The semiconductor chip 120 may be an integrated circuit (IC) in which hundreds to millions of devices are integrated into one chip. For example, the semiconductor chip 120 may be a processor, such as a central processor, for example, a CPU, a graphics processor, for example, a GPU, a field programmable gate array (FPGA), a digital signal processor, a cryptographic processor, a microprocessor, a microcontroller, and the like, in detail, may be an application processor (AP), but is not limited thereto. For example, the semiconductor chip 120 may be a logic chip such as an analog-to-digital converter, an application-specific IC (ASIC), and the like, or may be a memory chip such as a volatile memory, for example, a DRAM, a nonvolatile memory, for example, a ROM, a flash memory, and the like. Further, these devices may also be disposed to be combined with each other.

The support frame 110 may maintain rigidity of the package according to a detailed material, and may serve to ensure uniformity of thickness of the encapsulant 131. The package may be used in a package-on-package (POP) structure by the support frame 110. The support frame 110 includes a plurality of wiring patterns 112a, 112b and 112c, may redistribute the contact pads 122 of the semiconductor chip 120 in various ways, and may simplify a redistribution layer of another region, for example, the connection member 140. In the cavity 110H, the semiconductor chip 120 is disposed to be spaced apart from the support frame 110 by a predetermined distance. A side surface of the semiconductor chip 120 may be surrounded by the support frame 110.

A separate passive component such as a capacitor or an inductor may be further disposed in the cavity 110H as required, and may be electrically connected to the semiconductor chip 120 by the redistribution layer 145 or the like.

The support frame 110 employed in this embodiment may include a first insulating layer 111a, a first wiring pattern 112a connected to the redistribution layer 145 of the connection member 140 and embedded in the first insulating layer 111a, a second wiring pattern 112b disposed on a side of the first insulating layer 111a, opposite to a side thereof, in which the first wiring pattern 112a is embedded, a second insulating layer 111b disposed on the first insulating layer 111a and covering the second wiring pattern 112b, and a third wiring pattern 112c disposed on the second insulating layer 111b. The first to third wiring patterns 112a, 112b and 112c may be electrically connected to the contact pad 122. The first and second wiring patterns 112a and 112b and the second and third wiring patterns 112b and 112c may be electrically connected to each other through first and second vias 113a and 113b penetrating through the first and second insulating layers 111a and 111b, respectively.

As described above, by implementing the multilayer wiring patterns 112a, 112b and 112c in the support frame 110, the redistribution layer 145 of the connection member 140 may be further simplified. Thus, not only a yield reduction due to defects occurring in a complex redistribution layer formation process of the connection member 140 may be reduced, but also a thickness of the package may be reduced. As illustrated in FIG. 9, the first wiring pattern 112a may be recessed into the first insulating layer 111a, such that a lower surface of the first insulating layer 111a and a lower surface of the first wiring pattern 112a may have a step. For example, in this embodiment, by the step, a material of the encapsulant 131 may be prevented from bleeding and contaminating the first wiring pattern 112a in a process of forming the encapsulant 131.

The support frame 110 may be formed to have a thickness substantially corresponding to a thickness of the semiconductor chip 120, and the second wiring pattern 112b of the support frame 110 may be located between an active surface and an inactive surface of the semiconductor chip 120.

The support frame 110 may be formed by a general substrate process since a thickness of the support frame 110 may correspond to a thickness of the semiconductor chip 120 without any limitations, while the redistribution layer 145 of the connection member 140 may be formed by a fine pattern forming technique using photolithography to be further thinned. Thus, the thickness of the first to third wiring patterns 112a, 112b and 112c of the support frame 110 may be greater than the thickness of the redistribution layer 145 of the connection member 140.

As a material of the first and second insulating layers 111a and 111b of the support frame 110, for example, an insulating resin mixed with an inorganic filler may be used. For example, a resin containing a reinforcing material such as an inorganic filler of silica, alumina or the like may be used together with a thermosetting resin such as an epoxy resin or a thermoplastic resin such as polyimide. In detail, the insulating layers 111a and 111b of the support frame 110 may be formed using Ajinomoto Build-up Film (ABM), FR-4 resin, Bismaleimide Triazine (BT) resin, a photoimageable dielectric (PID) resin, BT resin, or the like, and may be formed using a material such as a prepreg resin or the like, in which a thermosetting resin or a thermoplastic resin is impregnated with a core material such as glass fiber (glass cloth, glass fabric), together with an inorganic filler, as required.

The first to third wiring patterns 112a, 112b and 112c of the support frame 110 may include a conductive material such as copper (Cu), aluminum (Al), silver (Ag), tin (Sn), gold (Au), nickel (Ni), lead (Pb), titanium (Ti), alloys thereof, or the like. The first to third wiring patterns 112a, 112b and 112c may perform various functions according to a design of a relevant layer. For example, a ground (GND) pattern, a power (PoWeR: PWR) pattern, and a signal (S) pattern may be used. In this case, the signal S pattern includes various signals, except for a ground (GND) pattern, a power (PWR) pattern and the like, for example, a data signal or the like. Further, a via pad pattern, a connection terminal pad pattern, and the like may be used.

As a material of the first and second vias 113a and 113b of the support frame 110, a conductive material may be used. The first and second vias 113a and 113b may be entirely filled with a conductive material, or may be formed as a conductive material is formed along a wall surface of a via hole. A portion of pad patterns of the first and second wiring patterns 112a and 112b may serve as a stopper when forming holes for the first and second vias 113a and 113b, and the first and second vias 113a and 113b may have a tapered shape in which a width of an upper surface thereof is greater than that of a lower surface. In this case, the first and second vias 113a and 113b may be integrated with a portion of the second and third wiring patterns 112b and 112c.

Although not illustrated in the drawings, a metal layer may be further disposed on a side wall of the cavity 110H, as required. The metal layer may serve to effectively dissipate heat generated from the semiconductor chip 120 and/or to shield electromagnetic waves. The cavity 110H may be a plurality of cavities 110H, and the semiconductor chip 120 or a passive component may be disposed in each of the plurality of cavities 110H. Additionally, structures known in the art may also be applied.

The encapsulant 131 may protect the semiconductor chip 120. An encapsulating method is not particularly limited, and any method may be used as long as at least a portion of the semiconductor chip 120 can be covered. For example, the encapsulant 131 may cover at least a portion of the inactive surface of the semiconductor chip 120 and the first surface 110A of the support frame 110, and may fill at least a portion of a space between a side surface of the cavity 110H and a side surface of the semiconductor chip 120. A detailed material of the encapsulant 131 is not particularly limited, and for example, an insulating material may be used. As the insulating material, a thermosetting resin such as an epoxy resin, a thermoplastic resin such as polyimide, or a resin in which these resins are mixed with a reinforcing material such as an inorganic filler, such as ABF, FR-4 resin, BT resin, a PID resin or the like, may be used. As the encapsulant 131, a known molding material such as EMC may be used. As required, a resin in which a thermosetting resin or a thermoplastic resin is impregnated with a core material of a glass fiber or the like together with an inorganic filler, may be used.

The connection member 140 may redistribute the contact pads 122 of the semiconductor chip 120. Tens to hundreds of contact pads 122 having various functions may be redistributed through the connection member 140, and may be physically and/or electrically connected externally through the electrical connecting structure 170 according to functions thereof. The connection member 140 includes the redistribution layer 145 connected to the connection region CA of the semiconductor chip 120 and extending to a lower surface of the support frame 110.

The redistribution layer 145 of the connection member 140 may be connected to the connection region CA of the semiconductor chip 120 and the first wiring pattern 112a disposed in a recessed portion of the support frame 110, to electrically connect the semiconductor chip 120 and the wiring structure of the support frame 110.

The redistribution layer 145 may include copper (Cu), aluminum (Al), silver (Ag), tin (Sn), gold (Au), nickel (Ni), lead (Pb), titanium (Ti), or alloys thereof. Similar to the first to third wiring patterns 112a, 112b and 112c, the redistribution layer 145 may perform various functions according to a design of a relevant layer. For example, the redistribution layer 145 may include a ground (GND) pattern, a power (PWR) pattern, a signal (S) pattern, and the like.

The passivation layer 150 may be configured to protect the connection member 140 from external physical chemical damage or the like. The passivation layer 150 may have tens to thousands of openings exposing at least portions of the redistribution layers 145 of the connection member 140. A material of the passivation layer 150 is not particularly limited, and for example, a photoimageable dielectric material such as a photoimageable dielectric resin, or a solder resist, may be used. Alternatively, the passivation layer 150 may be formed using an insulating resin mixed with an inorganic filler, for example, ABF or the like. In this case, the insulating layer 141 of the connection member 140 may also include an insulating resin mixed with an inorganic filler.

The electrical connection structure 170 may be used as a connection terminal to physically and/or electrically connecting the semiconductor package 100 externally. The electrical connection structure 170 may be formed using a conductive material, for example, a low melting point alloy such as Sn—Al—Cu. The electrical connection structure 170 may be a land, a ball, a pin, or the like. The electrical connection structure 170 may be formed of multiple layers or a single layer.

The number, spacing, arrangement type, and the like of the electrical connection structure 170 are not particularly limited, and may be sufficiently modified according to the design specifications of an engineer in the art. For example, the number of the electrical connection structures 170 may be provided in an amount of several tens to several thousands, depending on the number of the contact pads 122 of the semiconductor chip 120, and may be more or less.

At least one of the electrical connection structures 170 is disposed in a fan-out region. The fan-out region indicates a region outside the area in which the semiconductor chip 120 is disposed. Such a fan-out package may be more reliable than a fan-in package, may implement a plurality of I/O terminals, and may facilitate 3D interconnection. Unlike a ball grid array (BGA) package and a land grid array (LGA) package, the fan-out package may be mounted on electronic devices without a separate substrate, and thus, has positive attributes in terms of slimming as well as price competitiveness.

Hereinafter, with reference to FIGS. 13A to 13F, a method of manufacturing a semiconductor package according to an exemplary embodiment of the present disclosure will be described.

Various features and advantages of a semiconductor package according to an exemplary embodiment may be understood in detail in describing the method of manufacturing a semiconductor package.

Figure 13A:
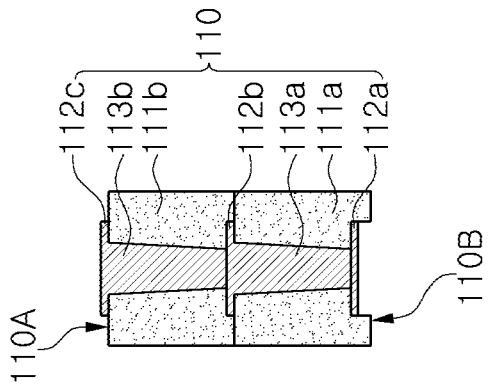
FIGS. 13A to 13F are cross-sectional views of main processes for explaining a method of manufacturing a semiconductor package according to an exemplary embodiment of the present disclosure.
Figure 13A:
Figure 13A:
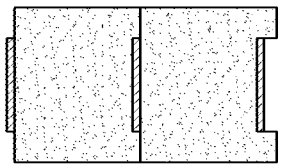

Referring to FIG. 13A, a support frame 110 having first and second surfaces 110A and 110B opposing each other and having a cavity 110H penetrating through the first and second surfaces 110A and 110B may be prepared.

In detail, the support frame 110 is prepared by preparing a carrier film (not illustrated) on which a metal film is formed, forming a first wiring pattern 112a using a metal film as a seed layer, forming a first insulating layer 111a on the metal film to cover the first wiring pattern 112a, forming a second wiring pattern 112b on the first insulating layer 111a, forming a second insulating layer 111b on the first insulating layer 111a to cover the second wiring pattern 112b, and forming a third wiring pattern 112c on the second insulating layer 111b. Next, after the support frame 110 is separated from the carrier film, the metal film remaining on the first wiring pattern 112a may be removed to obtain the support frame 110 illustrated in FIG. 13A. A recessed portion may be formed in the support frame 110 when the metal film is removed. The first to third wiring patterns 112a, 112b and 112c may be formed by performing patterning using a dry film or the like and then filling a pattern in a plating process known in the art. The first and second insulating layers 111a and 111b may be formed by a known lamination method or a coating and curing method. The formation of the cavity 110H may be performed using a laser drilling and/or mechanical drilling and/or sandblast method or the like.

Figure 13B:
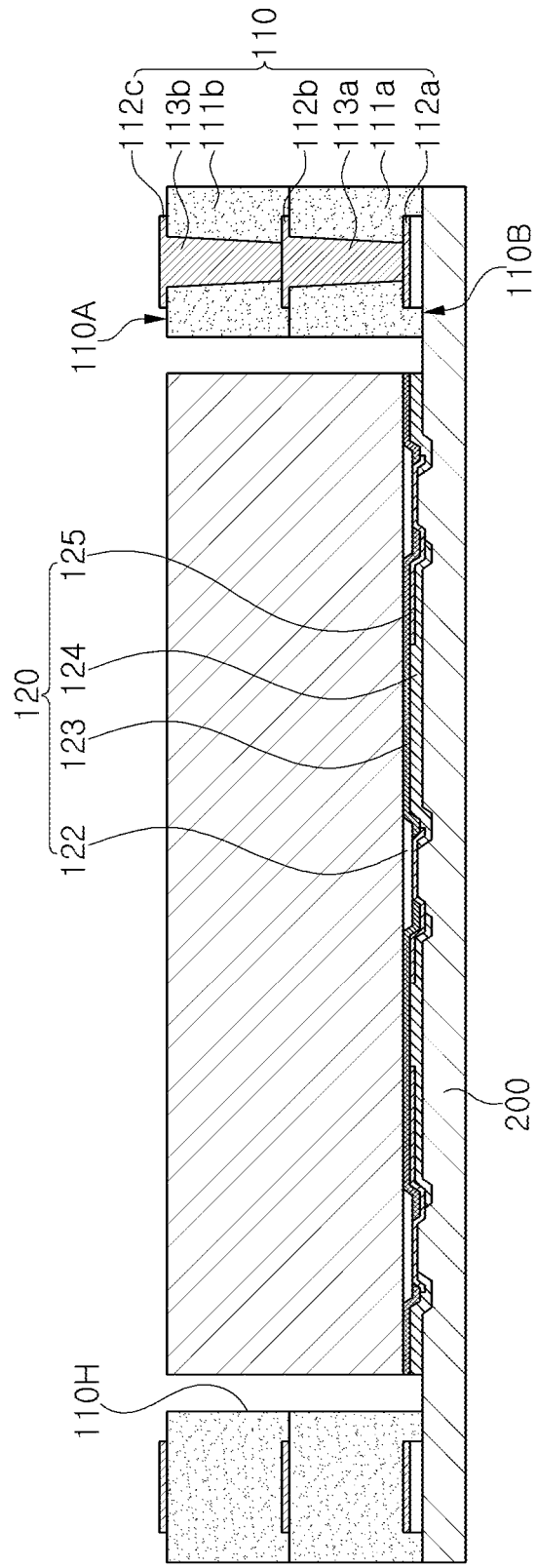

Subsequently, referring to FIG. 13B, the second surface 110B of the support frame 110 may be attached to an adhesive film 200, and a semiconductor chip 120 may be disposed in the cavity 110H of the support frame 110.

As the adhesive film 200, any material may be used as long as it can fix the support frame 110, and a known tape or the like may be used in an example without limitations. Examples of a known tape include a thermosetting adhesive tape, an ultraviolet ray-curable adhesive tape, and the like.

The semiconductor chip 120 may be attached onto the adhesive film 200 in the cavity 110H. The semiconductor chip 120 may be disposed in a face-down manner such that an active surface on which the contact pad 122 is disposed is attached to the adhesive film 200. The semiconductor chip 120 includes a RDL pattern 125 connected to the contact pad 122, and first and second insulating films 123 and 124 disposed on the active surface. The semiconductor chip 120 may have a connection region exposed through an opening of the second insulating film 124.

Figure 13C:
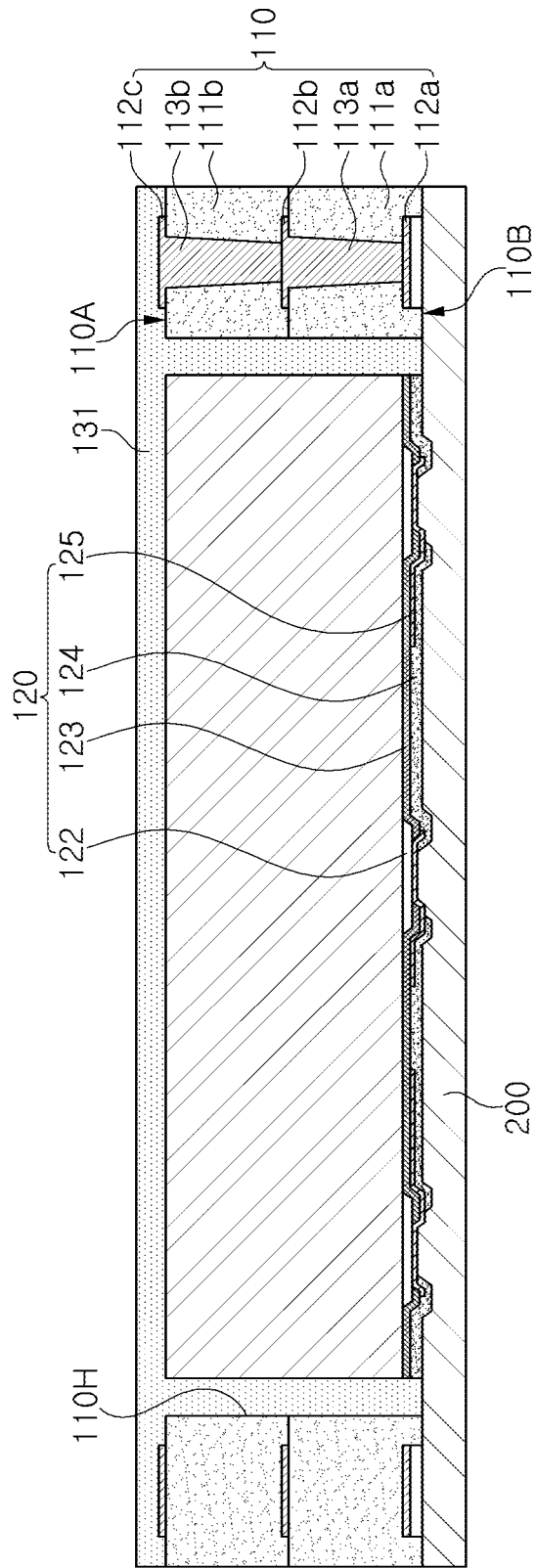

Next, referring to FIG. 13C, the semiconductor chip 120 is encapsulated using the encapsulant 131.

The encapsulant 131 may be disposed to encapsulate the semiconductor chip 120 disposed in the cavity 110H. In the exemplary embodiment, the encapsulant 131 may cover the first surface 110A of the support frame 110 and the inactive surface of the semiconductor chip 120, and may fill at least a portion of a space in the cavity 110H. The encapsulant 131 may be formed by a method known in the art. For example, the encapsulant 131 may be formed by laminating and then curing a precursor. Alternatively, a liquid resin for the encapsulant 131 may be coated on the adhesive film 200, to encapsulate the semiconductor chip 120, followed by curing.

Figure 13D:
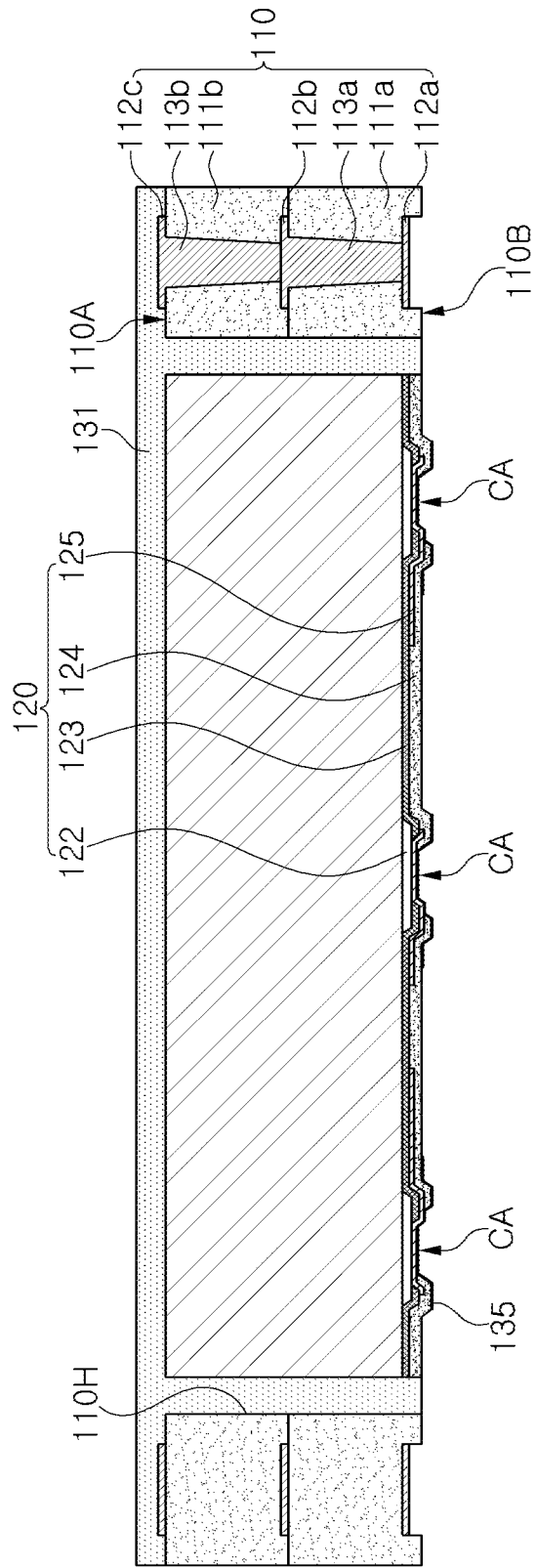

Referring to FIG. 13D, the adhesive film 200 may be removed, and a conductive crack preventing layer 135 may be formed on the second insulating film 124 of the semiconductor chip 120.

The adhesive film 200 may be peeled, after a heat treatment is applied or ultraviolet irradiation is applied depending on the kind thereof to reduce adhesive force. The conductive crack preventing layer 135 extending to a portion of the second insulating film 124 around the first opening O1 may be formed on the connection region CA.

The conductive crack preventing layer 135 may be formed by depositing a required metal on an entire surface and then by selectively etching a remaining region except a connection region and a portion of the second insulating film on a periphery thereof, using photolithography. For a sufficient stress and crack propagation preventing effect, a thickness of the conductive crack preventing layer 135 may be in the range from 50 nm to 1 μm. In one embodiment, the thickness of the conductive crack preventing layer 135 is 100 nm, 200 nm, 300 nm, 400 nm, 500 nm, 600 nm, 700 nm, 800 nm, or 900 nm.

The conductive crack preventing layer 135 may be formed of a conductive material such as a metal, having excellent adhesion. For example, the conductive crack preventing layer 135 may include at least one of titanium (Ti) or tungsten (W). In a specific example, the conductive crack preventing layer 135 may be formed of the same material as that of a seed layer of the redistribution layer 145 to be formed in a subsequent process. For example, the conductive crack preventing layer 135 may be a Ti/W layer or a Ti/Cu layer.

Figure 13E:
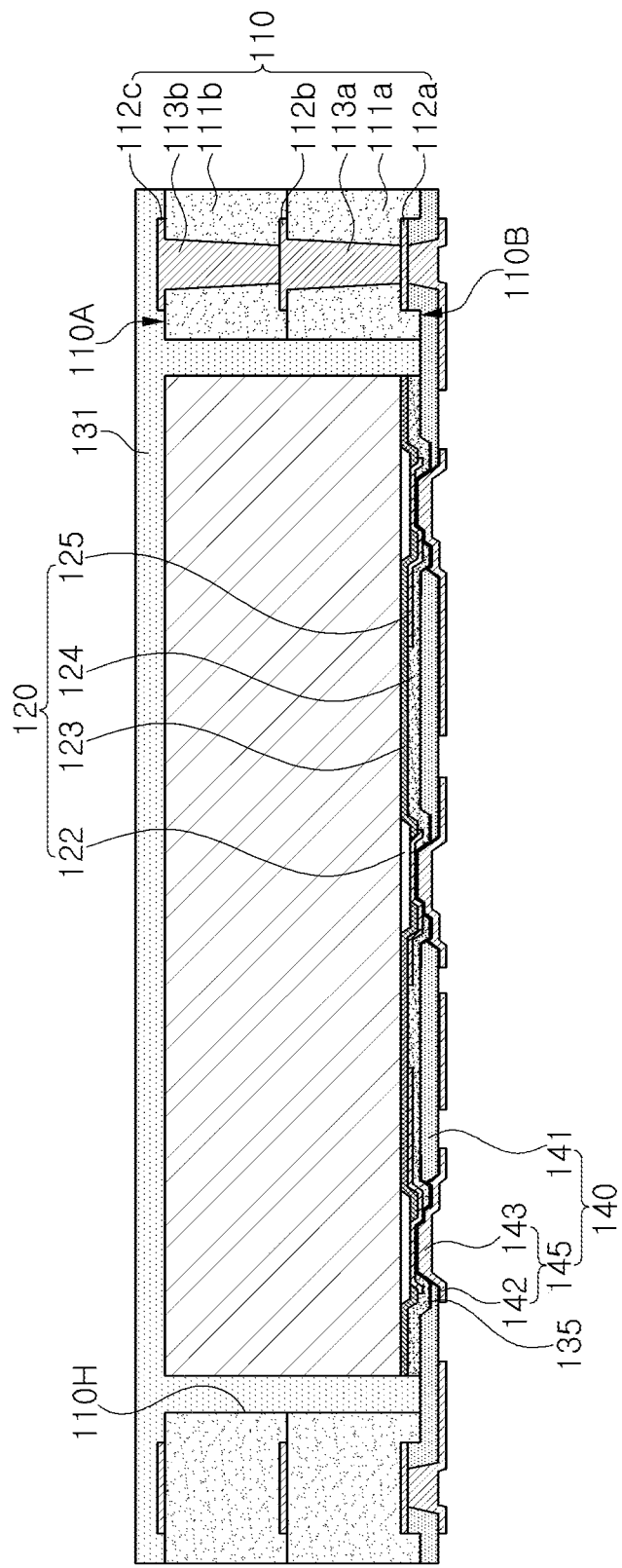

Next, referring to FIG. 13E, a connection member 140 may be formed on the second surface 110B of the support frame 110 from which the adhesive film 200 has been removed and on an active surface of the semiconductor chip 120.

An insulating layer may be formed on the second surface 110B of the support frame 110 and the active surface of the semiconductor chip 120, and a second opening O2 may be formed to expose the connection region CA. The second opening O2 may be formed to have an area larger than an area of a first opening O1 such that the connection region CA is exposed, in consideration of an alignment error. The conductive crack preventing layer 135 may be exposed by the second opening. The insulating layer 141 may be formed of various insulating materials. For example, the insulating layer 141 may include a thermosetting resin such as an epoxy resin, a thermoplastic resin such as polyimide. In a specific example, the insulating layer 141 may include a prepreg resin, Ajinomoto Build-up Film (ABF), FR-4 resin, BT resin, or a photoimageable dielectric (PID) resin. The insulating layer 141 may be formed of a different insulating material from a material of the second insulating film 124. For example, the second insulating film 124 may include a nonphotoimageable dielectric material, and the insulating layer 141 may include a photoimageable dielectric material.

The redistribution layer 145 may be formed to be electrically connected to the connection region CA through the conductive crack preventing layer 135 exposed through the second opening O2. The redistribution layer 145 may be formed in a recessed portion of the support frame 110 to be connected to the first wiring pattern 112a of the support frame 110. The redistribution layer 145 as described above may be formed by forming a seed layer and then forming a plating layer such as a Cu layer on the seed layer. In a structural aspect, the redistribution layer 145 may include a RDL pattern 142 disposed on the insulating layer 141, and a RDL via 143 penetrating through the insulating layer 141 to be connected to the connection region CA and the like, distinguished from each other.

Figure 13F:
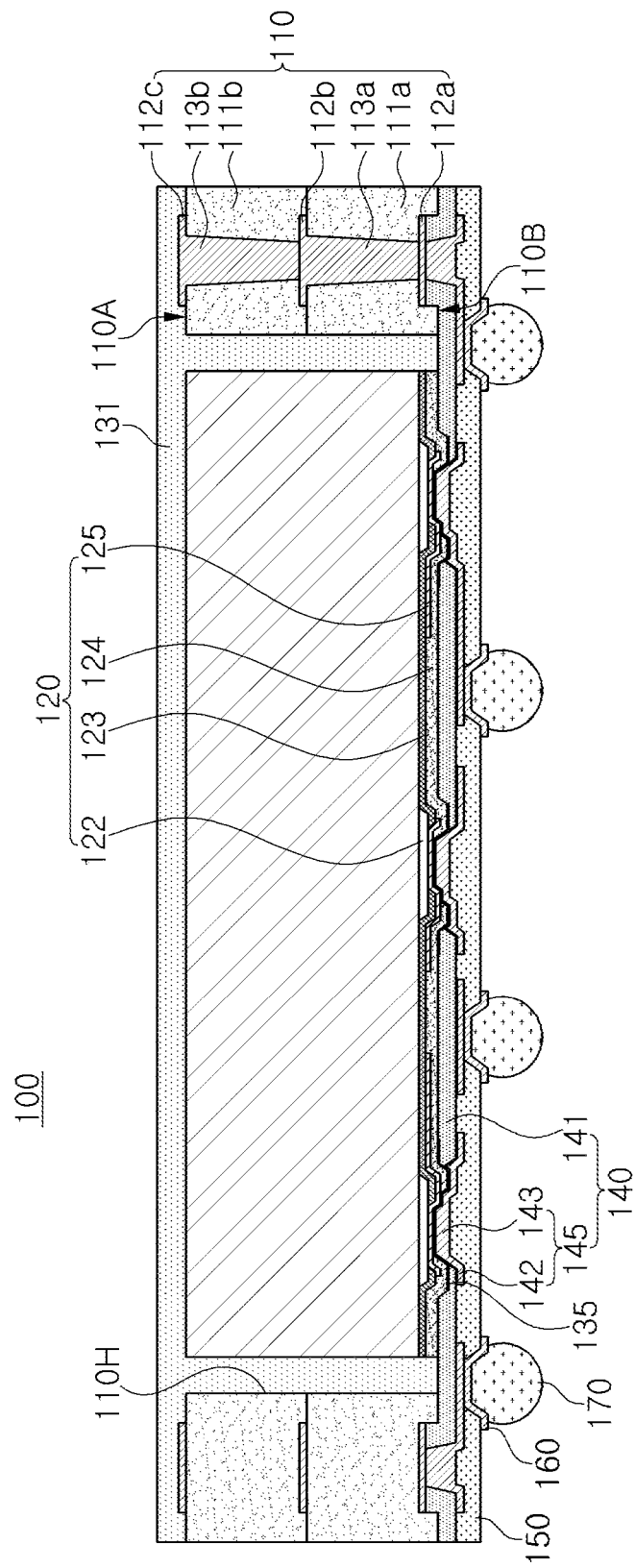

Referring to FIG. 13F, a passivation layer 150 may be formed on the connection member 140, and a UBM layer 160 connected to the redistribution layer 145 and an electrical connection structure 170 are formed.

The passivation layer 150 may be formed by laminating a precursor and then curing the precursor, or by applying a liquid resin and then curing the liquid resin. The passivation layer 150 may be formed with an opening exposing a portion of the redistribution layer 145 of the connection member 140. The UBM layer 160 may be formed on the exposed region of the redistribution layer 145 by a metallization method known in the art, and the electrical connection structure 170 may be formed on the UBM layer 160. The above-described processes are performed in a large-scale panel unit, and the package may be singulated into individual semiconductor packages using a sawing process after the above-described process is completed.

Figure 14:
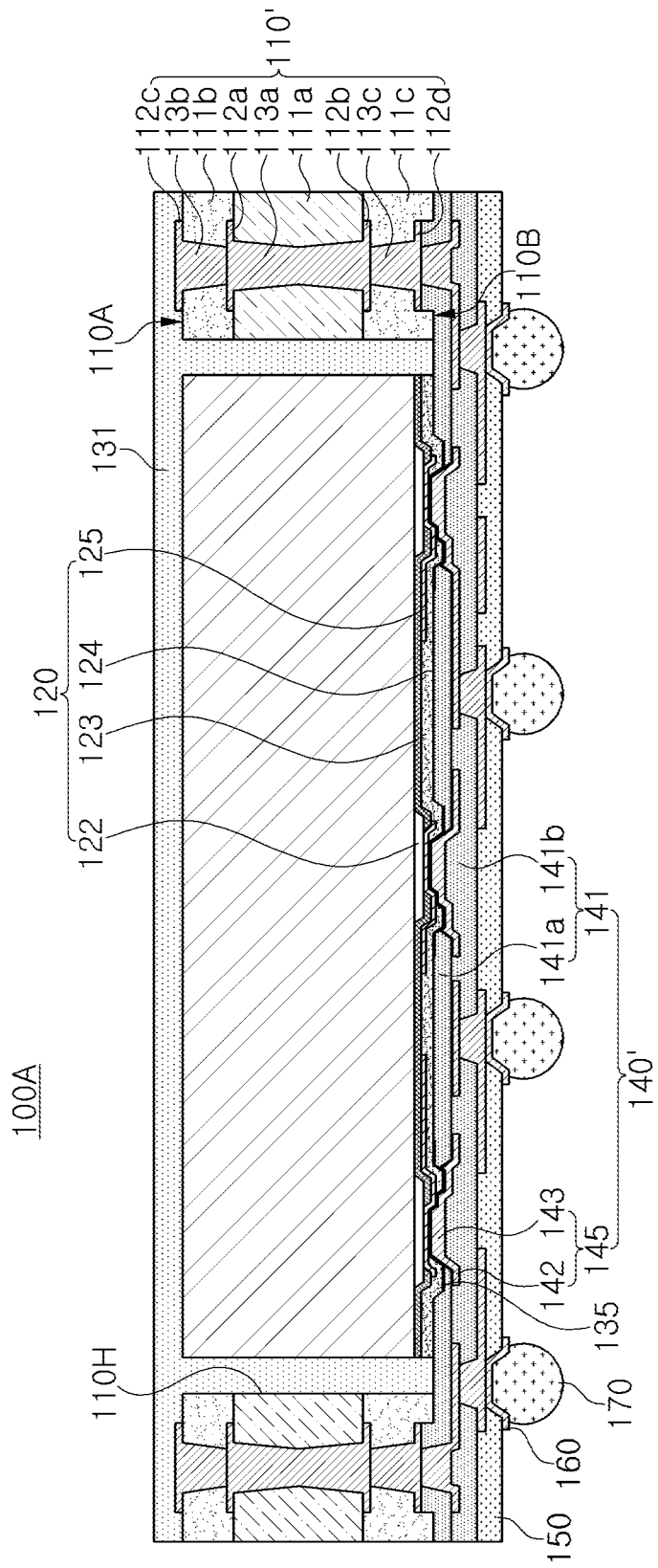
FIGS. 14 and 15 are schematic cross-sectional views of a semiconductor package according to various embodiments of the present disclosure.
Figure 15:
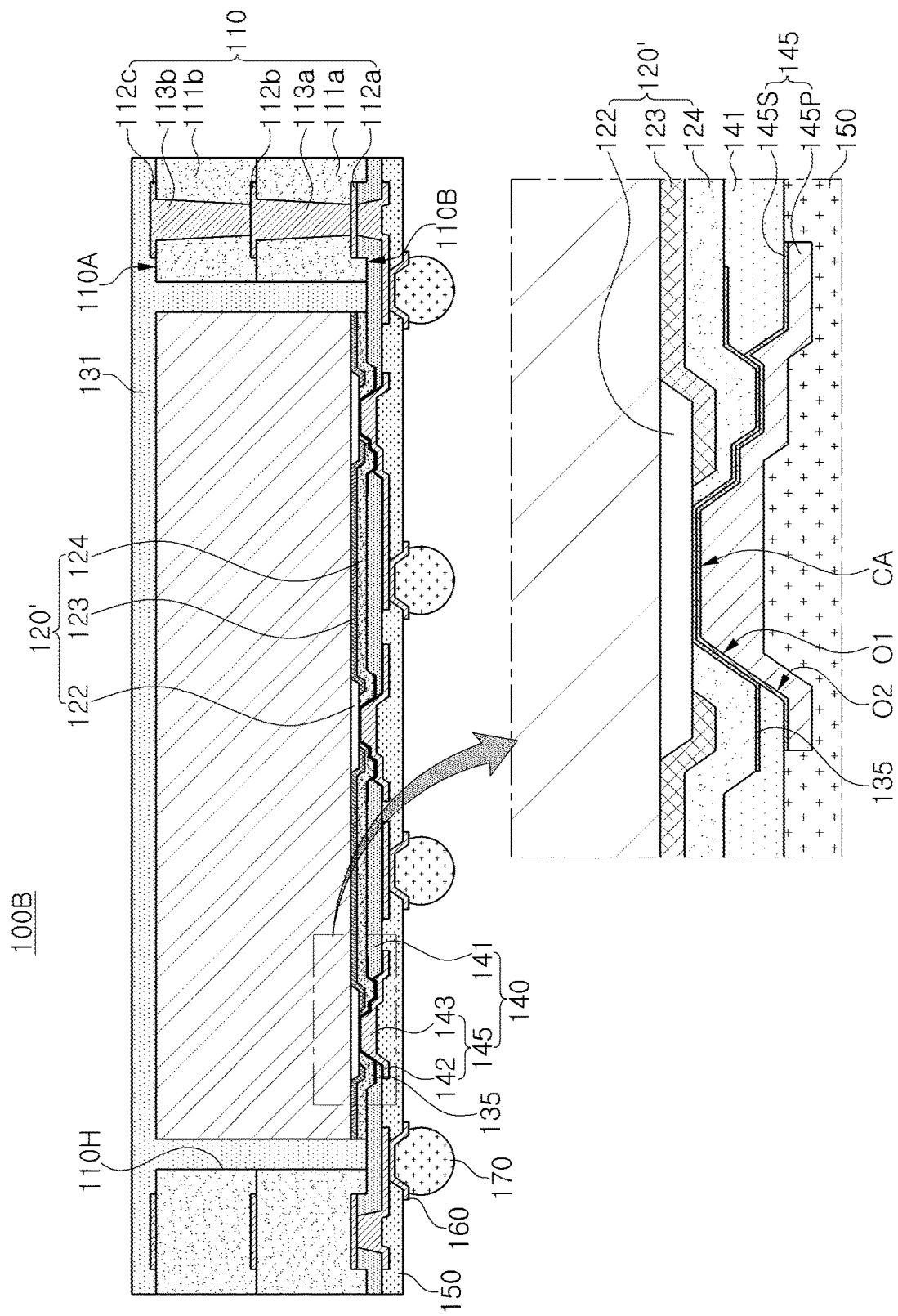

The exemplary embodiments of the present disclosure may be modified and implemented in various forms. FIGS. 14 and 15 are schematic cross-sectional views of a semiconductor package according to various embodiments.

Referring to FIG. 14, a semiconductor package 100A according to an exemplary embodiment may have a structure similar to the structure shown in FIGS. 9 and 10, except for a wiring structure of a support frame 110' and a redistribution layer structure of a connection member 140'. The description of components of this exemplary embodiment may be referred to the description of the same or similar components of the semiconductor package 100 illustrated in FIGS. 9 and 10, unless in detail explained otherwise.

The wiring structure of the support frame 110' employed in the exemplary embodiment may include first and second wiring patterns 112a and 112b disposed on two surfaces of a first insulating layer 111a, respectively, a third wiring pattern 112c disposed on a second insulating layer 111b, a fourth wiring pattern 112d disposed on a third insulating layer 111c, a first via 113a penetrating through the first insulating layer 111a to connect the first and second wiring patterns 112a and 112b, a second via 113b penetrating through the second insulating layer 111b to connect the first and third wiring patterns 112a and 112c, and a third via 113c penetrating through the third insulating layer 111c to connect the second and fourth wiring patterns 112b and 112d.

The connection member 140' employed in the exemplary embodiment has two levels of redistribution structures, for example, includes first and second redistribution layers 145a and 145b, disposed on the first and second insulating films 141a and 141b, respectively. The first redistribution layer 145a includes a first RDL pattern 142a disposed on the first insulating film 141a, and a first via 143a penetrating through the first insulating film 141a to be connected to the first RDL pattern 142a and a connection region. The second redistribution layer 145b includes a second RDL pattern 142b disposed on the second insulating film 141b, and a second via 143b penetrating through the second insulating film 141b to connect the first and second RDL patterns 142a and 142b. As described above, although the connection member 140' is illustrated as having a two-level redistribution structure having the first redistribution layer 142a and the second redistribution layer 142b by way of example, an exemplary embodiment thereof is not limited thereto. For example, the connection member 140' may be implemented by a structure having three or more redistribution layers.

Referring to FIG. 15, a semiconductor package 100B according to an exemplary embodiment may have a structure similar to the structure shown in FIGS. 9 and 10, except that a RDL pattern is not introduced into a passivation structure of a semiconductor chip 120'. The description of components of this exemplary embodiment may be referred to the description of the same or similar components of the semiconductor package 100 shown in FIGS. 9 and 10, unless in detail explained otherwise.

The semiconductor chip 120' employed in this embodiment may include a first insulating film 123 disposed on the active surface and exposing a contact pad 122, and a second insulating film 124 disposed on the first insulating film 123 and having a first opening O1 exposing a connection region CA of the contact pad 122. A conductive crack preventing layer 135 may be disposed on the connection region CA and extend to a portion of the second insulating film 124 around the first opening O1.

The connection member 140 may be disposed on a second surface 110B of a support frame 110 and on an active surface of the semiconductor chip 120'. An insulating layer 141 of the connection member 140 may have a second opening O2 exposing the connection region CA and having an opening size greater than that of the first opening O1. A redistribution layer 145 may be connected to the connection region CA through the second opening O2.

The second opening O2 may have an area larger than an area of the first opening O1 when viewed from above, and the conductive crack preventing layer 135 may extend between the insulating layer 141 and the second insulating film 124. The conductive crack preventing layer 135 may prevent stress or cracks from propagating in a direction toward the semiconductor chip 120', even in a case in which high stress or cracks occur at a contact point (the insulating layer 141 and the redistribution layer 145 and the second insulating film 124) between dissimilar materials located along a rim of the second opening O2, thereby significantly increasing reliability of the package.

As set forth above, according to an exemplary embodiment, by introducing the conductive crack preventing layer into the passivation structure of the semiconductor chip, the occurrence of stress and cracks due to a difference in thermal expansion coefficients with the redistribution layer formed on a pad region of the semiconductor chip may be effectively prevented.

The meaning of being connected in the present disclosure encompasses not only a direct connection, but also includes an indirect connection through an adhesive layer or the like. In addition, the term "electrically connected" is a concept including both a physical connection and non-connection. Further, the expressions of the first, second, and the like are used to distinguish one component from another, and do not limit the order and/or importance of the components. In some cases, without departing from the scope of the present disclosure, a first component may be referred to as a second component, and similarly, a second component may be referred to as a first component.

The expression, an example, used in this disclosure does not mean the same embodiment, but is provided for emphasizing and explaining different unique features. However, the above-mentioned examples do not exclude being implemented in combination with the features of other examples.

For example, although the description in the specific example is not described in another example, it may be understood as an explanation related to another example, unless otherwise described or contradicted by the other example.

The terminology used herein is for describing various examples only, and is not to be used to limit the disclosure. The singular forms include plural expressions unless the context clearly is otherwise indicated.

While exemplary embodiments have been shown and described above, it will be apparent to those skilled in the art that modifications and variations could be made without departing from the scope of the present invention as defined by the appended claims.

What is claimed is:

1. A method of manufacturing a semiconductor package, the method comprising:
preparing a semiconductor chip having an active surface on which contact pads are arranged, the semiconductor chip comprising a first insulating film disposed on the active surface and exposing the contact pads, and a second insulating film disposed on the first insulating film and comprising a first opening exposing connection regions of the contact pads,
forming a conductive crack preventing layer on the connection regions to extend onto a portion of the second insulating film around the first opening;
forming an insulating layer on the active surface of the semiconductor chip;
forming a second opening in the insulating layer, the second opening exposing a portion of the conductive crack preventing layer on the connection regions; and
forming a redistribution layer electrically connected to the connection regions through the second opening and extending onto the insulating layer.

2. The method of claim 1, wherein an extending portion of the conductive crack preventing layer between the second insulating film and the insulating layer has a width of at least 5 μm.

3. The method of claim 1, wherein the conductive crack preventing layer has a thickness equal to 1 μm or less.

4. The method of claim 1, wherein the conductive crack preventing layer has a thickness equal to 50 nm or more.

5. The method of claim 1, wherein the conductive crack preventing layer comprises at least one of titanium (Ti) or tungsten (W).

6. The method of claim 1, wherein the second opening has an area larger than an area of the first opening, and exposes onto a portion of the conductive crack preventing layer around the first opening.

7. The method of claim 1, wherein the redistribution layer is connected to the exposed portion of the conductive crack preventing layer.

8. The method of claim 1, wherein at least a portion of the redistribution layer extending onto the insulating layer and the conductive crack preventing layer are disposed to overlap with the insulating layer therebetween.

9. The method of claim 1, wherein the forming the redistribution layer comprises:
forming a seed layer and forming a plating layer on the seed layer.

10. The method of claim 9, wherein the conductive crack preventing layer comprises a same material as a material of the seed layer.

11. The method of claim 10, wherein the conductive crack preventing layer and the seed layer are a titanium/tungsten (Ti/W) layer or a titanium/copper (Ti/Cu) layer.

12. The method of claim 1, wherein the first insulating film comprises at least one of an oxide or a nitride.

13. The method of claim 1, wherein the second insulating film comprises an organic insulating material.

14. The method of claim 1, wherein the second insulating film comprises a non-photoimageable dielectric material, and the insulating layer comprises a photoimageable dielectric material.

15. A method of manufacturing a semiconductor package, the method comprising:
preparing a semiconductor chip having an active surface, and comprising contact pads arranged on the active surface, a first insulating film disposed on the active surface and exposing the contact pads, and a second insulating film disposed on the first insulating film and comprising a first opening exposing connection regions of the contact pads; and
forming a connection member on the active surface of the semiconductor chip,
wherein the forming the connection member comprises:
forming a conductive crack preventing layer on the connection regions and extending onto a portion of the second insulating film around the first opening;
forming a first insulating layer on the active surface of the semiconductor chip to cover the conductive crack preventing layer;
forming a second opening in the first insulating layer, the second opening exposing a portion of the conductive crack preventing layer on the connection regions, the second opening having an area larger than an area of the first opening; and
forming a first redistribution layer electrically connected to the connection regions through the second opening and extending onto the first insulating layer.

16. The method of claim 15, wherein the conductive crack preventing layer extends between the first insulating layer and the second insulating film.

17. The method of claim 15, wherein the first redistribution layer comprises a seed layer and a plating layer on the seed layer, and the conductive crack preventing layer comprises a same material as a material of the seed layer.

18. The method of claim 15, wherein the forming the connection member further comprises:
forming a second insulating layer on the first insulating layer to cover the first redistribution layer, and
forming a second redistribution layer on a second insulating layer, the second redistribution layer connected to the first redistribution layer through the second insulating layer.

19. The method of claim 15, further comprising forming an encapsulant on the connection member to encapsulate the semiconductor chip.

20. A method of manufacturing a semiconductor package, the method comprising:
preparing a semiconductor chip having an active surface, and comprising contact pads arranged on the active surface, and a first insulating film disposed on the active surface and exposing the contact pads, and a second insulating film disposed on the first insulating film and comprising a first opening exposing connection regions of the contact pads;
preparing a frame having first and second surfaces opposing each other and comprising a cavity penetrating through the first and second surfaces;
attaching the second surface of the frame to an adhesive film;
disposing the semiconductor chip in the cavity of the frame such that the active surface is attached to the adhesive film;
encapsulating the semiconductor chip in the cavity of the frame using an encapsulant;
removing the adhesive film from the semiconductor chip and the frame;
forming a conductive crack preventing layer on the connection regions and extending onto a portion of the second insulating film around the first opening;
forming a first insulating layer on the active surface of the semiconductor chip and the second surface of the frame to cover the conductive crack preventing layer;
forming a second opening in the first insulating layer, the second opening exposing a portion of the conductive crack preventing layer on the connection regions; and
forming a first redistribution layer electrically connected to the connection regions through the second opening and extending onto the first insulating layer.

* * * * *